United States Patent
Kwon et al.

(10) Patent No.: US 11,609,278 B2
(45) Date of Patent: Mar. 21, 2023

(54) APPARATUS AND METHOD FOR DETERMINING SENSING ERROR OF LOW VOLTAGE DC-DC CONVERTER

(71) Applicants: HYUNDAI MOTOR COMPANY, Seoul (KR); KIA CORPORATION, Seoul (KR); KYUNGSHIN CORP., Incheon (KR)

(72) Inventors: Soon Myung Kwon, Suwon-si (KR); Sae Rom Kim, Seoul (KR); Sung Hwan Kim, Incheon (KR)

(73) Assignees: HYUNDAI MOTOR COMPANY, Seoul (KR); KIA CORPORATION, Seoul (KR); KYUNGSHIN CORP., Incheon (KR)

( * ) Notice: Subject to any disclaimer, the term of this patent is extended or adjusted under 35 U.S.C. 154(b) by 184 days.

(21) Appl. No.: 17/313,307

(22) Filed: May 6, 2021

(65) Prior Publication Data

US 2022/0065946 A1    Mar. 3, 2022

(30) Foreign Application Priority Data

Sep. 3, 2020    (KR) .................. 10-2020-0112325

(51) Int. Cl.
*H02J 7/00* (2006.01)
*G01R 31/40* (2020.01)

(52) U.S. Cl.
CPC ........... *G01R 31/40* (2013.01); *H02J 7/0047* (2013.01); *H02J 2207/20* (2020.01)

(58) Field of Classification Search
CPC ..................................................... H02J 7/0047
See application file for complete search history.

(56) References Cited

U.S. PATENT DOCUMENTS

| 11,088,553 | B2 * | 8/2021 | Fu ........................ H02J 7/0029 |
| 2012/0303192 | A1 * | 11/2012 | Kim ...................... B60L 3/003 903/903 |
| 2014/0159670 | A1 * | 6/2014 | Lee ...................... B60L 3/0007 320/128 |
| 2017/0361791 | A1 * | 12/2017 | Yoon ...................... B60R 16/03 |
| 2022/0063414 | A1 | 3/2022 | Kim et al. |

FOREIGN PATENT DOCUMENTS

KR    10-2022-0026873 A    3/2022

* cited by examiner

*Primary Examiner* — Daniel Kessie
(74) *Attorney, Agent, or Firm* — Morgan, Lewis & Bockius LLP (57) ABSTRACT

An apparatus for determining a sensing error of a LDC, which controls and senses an output and an output cutoff of a first current inputted to a first load of a vehicle and an output and an output cutoff of a second current for charging a battery, includes a battery control device that senses the second current and a third current for discharging the battery; a power control device that receives the first current, the second current, and the third current and calculates a fourth current inputted to a second load for controlling the vehicle driving by controlling an operation of switching element; and a controller that determines whether the sensing error of the LDC occurs based on the first current, the second current, the third current, and the fourth current.

20 Claims, 8 Drawing Sheets

APPARATUS AND METHOD FOR DETERMINING SENSING ERROR OF LOW VOLTAGE DC-DC CONVERTER

CROSS-REFERENCE TO RELATED APPLICATION

This application claims the benefit of priority to Korean Patent Application No. 10-2020-00112325, filed in the Korean Intellectual Property Office on Sep. 3, 2020, the entire contents of which are incorporated herein by reference.

TECHNICAL FIELD

The present disclosure relates to an apparatus and a method for determining a sensing error of a low voltage DC-DC converter.

BACKGROUND

In the event of an error of a vehicle's power system in an autonomous vehicle, to prevent a case where control rights of the vehicle are not transferred to a driver, it is required to implement a power redundancy that allows the vehicle to evacuate to a safe zone.

The power redundancy may include a low voltage DC-DC converter (LDC) provided between a high voltage battery and a low voltage battery, and a power safety controller (PSU) provided between the low voltage battery and the LDC to supply a voltage of the low voltage battery to a load as a dual power source. However, when a sensing failure of a current output from the LDC occurs due to a sensing error of the LDC, it causes a problem such as battery discharge, and thus a technology capable of determining the LDC sensing error is required.

The information included in this Background section is only for enhancement of understanding of the general background of the present disclosure and may not be taken as an acknowledgement or any form of suggestion that this information forms the prior art already known to a person skilled in the art.

SUMMARY

The present disclosure has been made to solve the above-mentioned problems occurring in the prior art while advantages achieved by the prior art are maintained intact.

An aspect of the present disclosure provides an apparatus for determining a sensing error of a low voltage DC-DC converter (LDC) and a method thereof capable of preventing discharge of a battery and determining external defects due to an LCD sensing error in advance, by determining the LDC sensing error.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, an apparatus for determining a sensing error of a low voltage DC-DC converter (LDC) of a vehicle includes, wherein the LDC controls and senses an output and an output cutoff of a first current inputted to a first load of the vehicle and an output and an output cutoff of a second current for charging a battery; a battery control device that senses the second current and a third current for discharging the battery; a power control device that receives the first current, the second current, and the third current and calculates a fourth current inputted to a second load for controlling a vehicle driving by controlling an operation of a switching element, and a controller that determines whether the sensing error of the LDC occurs, based on the first current, the second current, the third current and the fourth current.

In an embodiment, the controller may determine the sensing error of the LDC occurs when a value of the first current inputted to the first load of the vehicle obtained while the LDC is in a current output state and the switching element is turned on is less than a reference value.

In an embodiment, the controller may compare the first current inputted to the first load of the vehicle obtained when the LDC is in a current output state and the switching element is turned on with the first current inputted to the first load of the vehicle obtained when the switching element is turned off, and determines whether the sensing error of the LDC occurs based on a result of the comparison.

In an embodiment, the controller may calculate the fourth current inputted to the second load for controlling the vehicle driving in each of a first condition, a second condition, and a third condition when the LDC is in a current output cutoff state, and the switching element is turned on, and determines whether the sensing error of the LDC occurs based on a result of the calculation.

In an embodiment, the controller may calculate the fourth current inputted to the second load for controlling the vehicle driving in the first condition, based on a difference between a current inputted to the power control device obtained when the LDC is in a current output state and the switching element is turned on and the second current for charging the battery.

In an embodiment, the controller may calculate the fourth current inputted to the second load for controlling the vehicle driving in the second condition, based on the third current for discharging current of the battery obtained when the LDC is in a current output state and the switching element is turned off.

In an embodiment, the controller may calculate the fourth current inputted to the second load for controlling the vehicle driving in the third condition, based on a difference between the third current for discharging the battery obtained when the LDC is in the current output cutoff state and the switching element is turned on and a current outputted from the power control device.

In an embodiment, upon determining that the fourth current inputted to the second load for controlling the vehicle driving calculated in the first condition and the third condition are different from each other, the controller may compare a result calculated in the first condition with a result calculated in the third condition and determines that the sensing error of the LDC occurs as a result of the comparison.

In an embodiment, upon determining that the fourth current inputted to the second load for controlling the vehicle driving are the same in the first condition and the third condition, the controller may compare the first current inputted to the first load of the vehicle obtained when the LDC is in a current output state and the switching element is turned on with the first current inputted to the first load of the vehicle obtained when the LDC is in the current output cutoff state and the switching element is turned on as a result of the comparison.

In an embodiment, when the first current inputted to the first load of the vehicle obtained while the LDC is in the current output state and the switching element is turned on is different from the first current inputted to the first load of the vehicle obtained while the LDC is in the current output cutoff state and the switching element is turned on, the controller may determine that the sensing error of the LDC occurs.

According to an aspect of the present disclosure, a method of determining a sensing error of a low voltage DC-DC converter (LDC) includes determining whether the sensing error of the LDC occurs, based on a first current, a second current, a third current and a fourth current, wherein the first current comprises a current inputted to a first load for the vehicle, wherein the second current comprises a current for charging a battery, wherein the third current comprises a current for discharging a battery, wherein the fourth current comprises a current inputted to a second load for the vehicle.

In an embodiment, when a value of the first current inputted to the first load of the vehicle obtained while the LDC is in a current output state and the switching element is turned on is less than a reference value the method may further determining that the sensing error of the LDC occurs.

In an embodiment, the method may further comparing the first current inputted to the first load of the vehicle obtained when the LDC is in a current output state and the switching element is turned on with the first current inputted to the first load of the vehicle obtained when the switching element is turned off; and determining whether the sensing error of the LDC occurs, based on a result of the comparison.

In an embodiment, when the LDC is in a current output cutoff state and the switching element is turned on, calculating the fourth current inputted to the second load for controlling the vehicle driving in each of a first condition, a second condition, and a third condition the method may further include determining whether the sensing error of the LDC occurs, based on a result of the calculation.

In an embodiment, the method may further include calculating the fourth current inputted to the second load for controlling the vehicle driving in the first condition, based on a difference between a current inputted to the power control device obtained when the LDC is in a current output state and the switching element is turned on and the second current for charging the battery.

In an embodiment, the method may further include calculating the fourth current inputted to the second load for controlling the vehicle driving in the second condition, based on the third current for discharging the battery obtained when the LDC is in a current output state and the switching element is turned off.

In an embodiment, the method may further include calculating the fourth current inputted to the second load for controlling the vehicle driving in the third condition, based on a difference between the third for discharging current of the battery obtained when the LDC is in the current output cutoff state and the switching element is turned on and a current outputted from the power control device.

In an embodiment, the method may further include comparing the fourth current calculated in the first condition with the fourth current calculated in the third condition; and upon determining that the fourth current inputted to the second load for controlling the vehicle driving calculated in the first condition and the third condition are different from each other, determining that the sensing error of the LDC occurs, as a result of the comparison.

In an embodiment, upon determining that the fourth current input to the second load for controlling the vehicle driving are the same in the first condition and the third condition, as the result of the comparison, the method may further include comparing the first current inputted to the first load of the vehicle obtained when the LDC is in a current output state and the switching element is turned on with the first current inputted to the first load of the vehicle obtained when the LDC is in the current output cutoff state and the switching element is turned on.

In an embodiment, when the first current inputted to the first load of the vehicle obtained while the LDC is in the current output state and the switching element is turned on is different from the first current inputted to the first load of the vehicle obtained while the LDC is in the current output cutoff state and the switching element is turned on, the method may further include determining that the sensing error of the LDC occurs.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Hereinafter, some embodiments of the present disclosure will be described in detail through drawings. In adding reference numerals to elements of each drawing, it should be noted that the same elements are assigned the same numerals as possible even if they are indicated on different drawings. In addition, in describing an embodiment of the present disclosure, if it is determined that a detailed description of a related known configuration or function obstructs an understanding of the embodiment of the present disclosure, a detailed description thereof will be omitted.

In describing the elements of the embodiments of the present disclosure, terms such as first, second, A, B, (a), (b), etc. may be used. These terms are only for distinguishing the element from other elements, and the nature, order, or order of the element is not limited by the term. In addition, unless otherwise defined, all terms used herein, including technical or scientific terms, have the same meaning as commonly understood by one of ordinary skill in the art to which the present disclosure belongs. Terms such as those defined in a commonly used dictionary should be interpreted as having a meaning consistent with the meaning in the context of the related technology, and should not be interpreted as an ideal or excessively formal meaning unless explicitly defined in this application.

Figure 1:
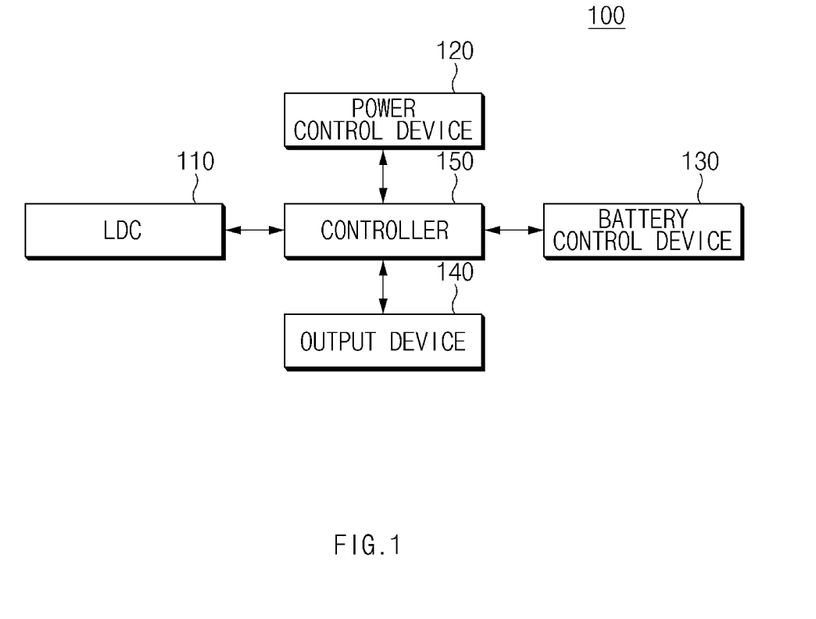
FIG. 1 is a diagram illustrating a configuration of an LDC sensing error determination apparatus according to an embodiment of the present disclosure.

FIG. 1 is a diagram illustrating a configuration of a low voltage DC-DC converter (LDC) sensing error determination apparatus according to an embodiment of the present disclosure.

As illustrated in FIG. 1, an LDC sensing error determination apparatus 100 may include an LDC 110, a power control device 120, a battery control device 130, an output device 140, and a controller 150.

The LDC 110 is a low voltage DC-DC converter (LDC), and may control and sense an output and an output cutoff of a current inputted to a load of a vehicle and a current for charging a battery. According to an embodiment, the LDC 110 may convert a current output from a high voltage battery according to the load of the vehicle, and the converted current may be inputted to the load driven by a low voltage of 12 V, for example. In this case, the load of the vehicle may include a lamp, an air conditioner, and the like. In addition, the LDC 110 may include a current sensor capable of sensing an output current, and in the present disclosure, determination of an LDC sensing error may mean determination of a failure of the current sensor provided in the LDC. The LDC 110 may also transmit the output current to the power control device 120.

The power control device 120 is provided between the LDC 110 and the battery control device 130 to connect or disconnect between the LDC 110 and the battery control device 130. Accordingly, the current output from the LDC 130 may or may not be transmitted to the battery control device 130. To this end, the power control device 120 may include a switching element such as a MOSFET or a relay, and may control an ON and OFF of the above-described switching element. In addition, the power control device 120 may receive the current output from the LDC 110 or the current discharged from the battery and may output the current to the load for controlling a vehicle driving. In this case, the load for controlling the vehicle driving may include a load for autonomous driving requiring a power redundancy, and the power control device 120 may supply emergency power to the load for controlling the vehicle driving. A detailed configuration of the power control device 120 will be described with reference to FIG. 2.

Figure 2:
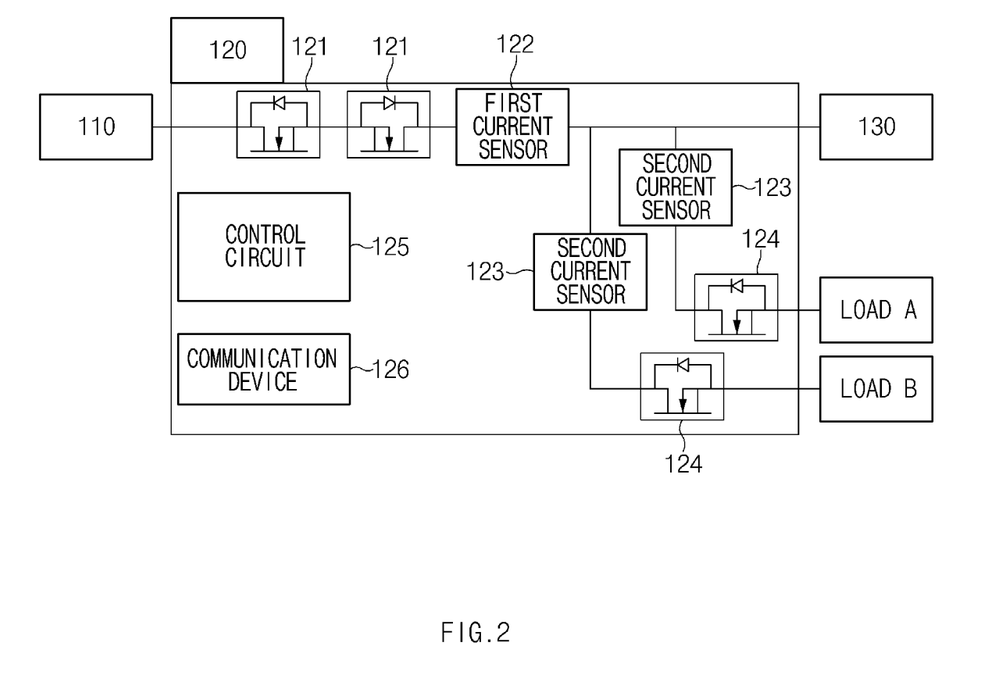
FIG. 2 is a detailed view of a power control device according to an embodiment of the present disclosure.

FIG. 2 is a detailed view of a power control device according to an embodiment of the present disclosure.

As illustrated in FIG. 2, the power control device 120 may include a first switching element 121 and a first current sensor 122 provided between the LDC 110 and the battery control device 130, a second current sensor 123 capable of sensing a current input to the load LOAD "A" and LOAD "B" for controlling the vehicle driving, and a second switching element 124 that connects or disconnects from the load for controlling the vehicle driving. In this case, the first switching element 121 and the second switching element 124 may include a field effect transistor (FET). The first current sensor 122 may sense a current output from the LDC 110 and a current output from the battery control device 130. In addition, the power control device 120 may include a control circuit 125 that controls operations of the first switching element 121, the second switching element 124, the first current sensor 122, and the second current sensor 123, and a communication device 126 that performs network connection with the control circuit 125, the LDC 110, and the battery control device 130.

The battery control device 130 may sense a current that is output from the LDC 110 and is input to the battery control device 130 to charge the battery, and may sense a current output from the battery control device 130 when the battery is discharged. In this case, the battery may include a low voltage (12 V) battery, and the battery control device 130 may include a current sensor for sensing a charge/discharge current of the battery.

The output device 140 includes a hardware device which may visually or audibly output a result determined by the controller 150. The output device 140 may be implemented with a display device or a sound output device. The display device may include a hardware device such as a display of a navigation (e.g., the output device 140), a HUD, a cluster, or the like.

The controller 150 may be implemented by various processing devices such as a microprocessor including a semiconductor chip or the like capable of performing operation or execution of various commands, and may control overall operations of the LDC sensing error determination apparatus according to an embodiment of the present disclosure. In detail, the controller 150 may obtain a current output from the LDC 110 depending on a current output or output cutoff of the LDC 110 and an ON and OFF operation of switching element included in the power control device 120, a current output to the load of the vehicle, a charge/discharge current output from the battery control device 130 and a current input to the power control device 120, and a current input to the load for controlling the vehicle driving. The controller 150 may determine whether the LDC sensing error occurs, based on the obtained currents. In addition, the controller 150 may be an electronic control unit (ECU).

More specific operations of the controller 150 will be described with reference to FIGS. 3 to 5.

Figure 3:
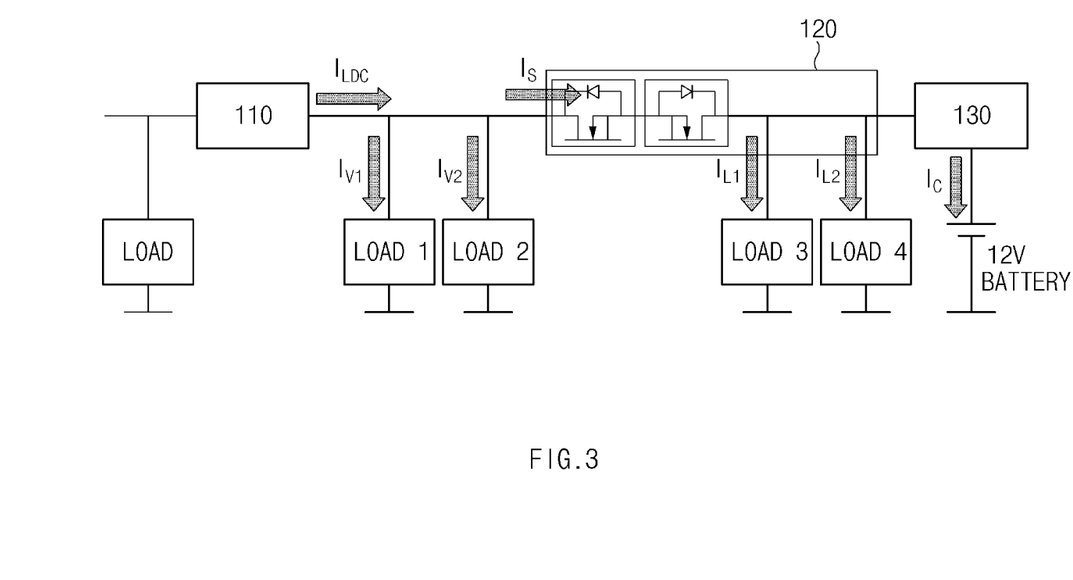
FIG. 3 is a diagram illustrating a current flow when an LDC is in a current output state and a switching element is turned on according to an embodiment of the present disclosure.

FIG. 3 is a diagram illustrating a current flow when an LDC is in a current output state and a switching element of the power control device 120 is turned on according to an embodiment of the present disclosure.

When a vehicle is in a general driving state, the LDC 110 is in a current output state, and the switching element of the power control device 120 is turned on, as illustrated in FIG. 3, the controller 150 may represent that a current $I_{LDC}$ output from the LDC 110 is equal to the sum of a current $I_V$ ($I_{V1}+I_{V2}$) input to the vehicle load LOAD 1 and LOAD 2 and a current $I_S$ input to the power control device 120, based on Kirchhoff's law, by Equation 1. In addition, the controller 150 may represent that the current $I_S$ input to the power control device 120 is equal to the sum of a current $I_L$ ($I_{L1}+I_{L2}$) input to a load LOAD 3 and LOAD 4 for controlling the vehicle driving and a charge current Ic of the battery, by Equation 2. In addition, the controller 150 may represent that the current $I_{LDC}$ output from the LDC 110 is equal to the sum of the current $I_V$ ($I_{V1}+I_{V2}$) input to the vehicle load LOAD 1 and LOAD 2, the current $I_L$ ($I_{L1}+I_{L2}$) input to the load LOAD 3 and LOAD 4 for controlling the vehicle driving, and a charge current IC of the battery, by Equation 3.

$$I_{LDC}=I_V+I_S \quad \text{[Equation 1]}$$

$$I_S=I_L+I_C \quad \text{[Equation 2]}$$

$$I_{LDC}=I_V+I_L+I_C \quad \text{[Equation 3]}$$

Figure 4:
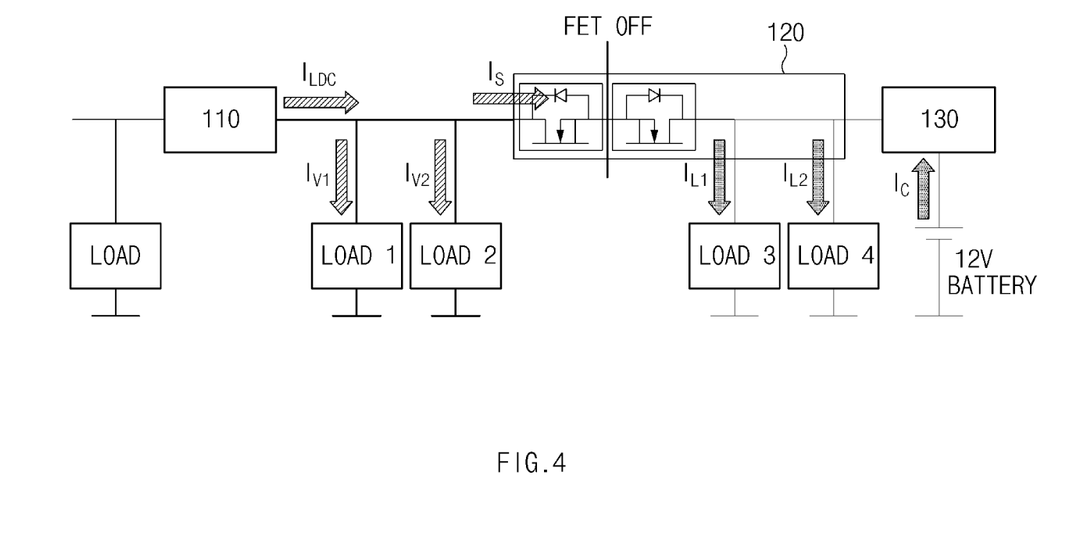
FIG. 4 is a diagram illustrating a current flow when an LDC is in a current output state and a switching element is turned off according to an embodiment of the present disclosure.

FIG. 4 is a diagram illustrating a current flow when an LDC is in a current output state and a switching element of the power control device 120 is turned off according to an embodiment of the present disclosure.

When the LDC 110 is in the current output state, the switching element of the power control device 120 is turned off, and the current $I_{LDC}$ and the current $I_S$ remain within an error range for more than a specific time (e.g. 5 seconds), the controller 150 may obtain a current output when the LDC 110 is in the current output state and the switching element of the power control device 120 is turned off. As illustrated in FIG. 4, when the LDC 110 is in the current output state and the switching element of the power control device 120 is turned off, since there is no current output from the power control device 120, based on Kirchhoff's law, the controller 150 may represent that the current $I_{LDC}$ output from the LDC 110 is the same as the obtained current $I_V$ ($I_{V1}+I_{V2}$) input to the vehicle load LOAD 1 and LOAD 2, by Equation 4. In addition, the controller 150 may represent that the discharge current Ic of the battery is the same as the current $I_L$ ($I_{L1}+I_{L2}$) input to the load LOAD 3 and LOAD 4 for controlling the vehicle driving, by Equation 5. According to an embodiment of the present disclosure, the controller 150 may determine whether the sensing error of the LDC occurs, based on Equation 1 and Equation 4.

$$I_{LDC}=I_V \quad \text{[Equation 4]}$$

$$I_C=I_L \quad \text{[Equation 5]}$$

Figure 5:
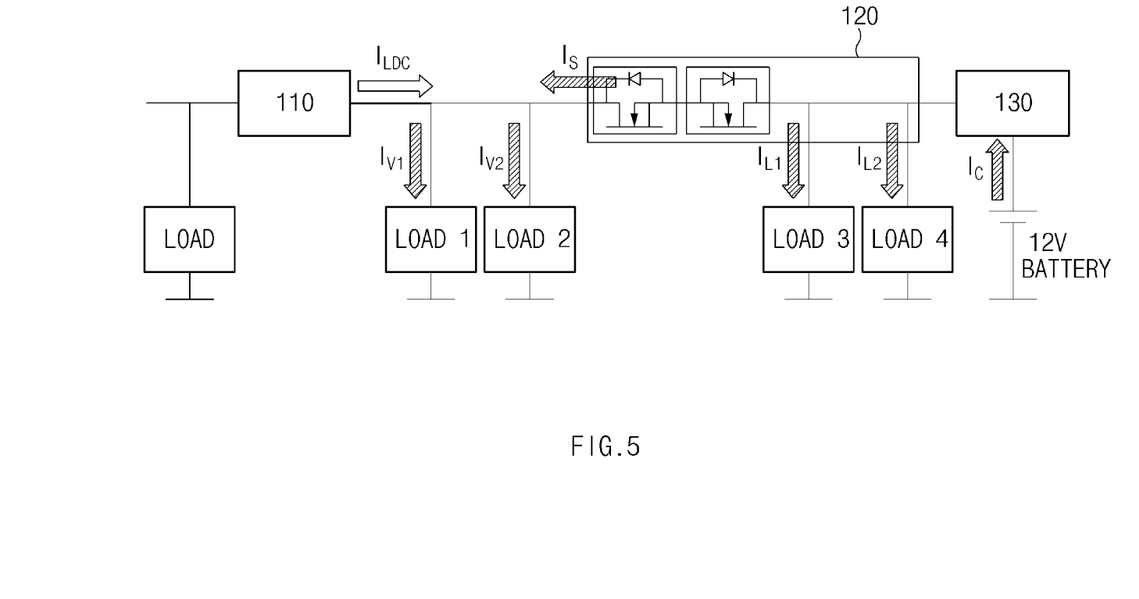
FIG. 5 is a diagram illustrating a current flow when an LDC is in a current output cutoff state and a switching element is turned on according to an embodiment of the present disclosure.

FIG. 5 is a diagram illustrating a current flow when an LDC is in a current output cutoff state and a switching element of the power control device 120 is turned on according to an embodiment of the present disclosure.

When a vehicle is in a parking state, the LDC 110 is in the current output cutoff state, and the switching element of the power control device 120 is turned on, as illustrated in FIG. 5, since there is no current output from the LDC 110, based on the Kirchhoff's law, the controller 150 may represent that the current Is output from the power control device 120 is the same as the current $I_V(I_{V1}+I_{V2})$ input to the vehicle load LOAD 1 and LOAD 2, by Equation 6. In addition, the controller 150 may represent that the discharge current Ic of the battery is equal to the sum of the current $I_S$ output from the power control device 120 and the current $I_L$ ($I_{L1}+I_{L2}$) input to the load LOAD 3 and LOAD 4 of the vehicle, by Equation 7. The controller 150 may represent that the discharge current Ic of the battery is equal to the sum of the current $I_L$ ($I_{L1}+I_{L2}$) input to the load LOAD 3 and LOAD 4 for controlling the vehicle driving and the current $I_V(I_{V1}+I_{V2})$ input to the vehicle load LOAD 1 and LOAD 2, by Equation 8.

According to an embodiment of the present disclosure, the controller 150 may determine whether the sensing error of the LDC occurs, based on Equation 2, Equation 5, and Equation 7.

$$I_S=I_V \quad \text{[Equation 6]}$$

$$I_C=I_L+I_S \quad \text{[Equation 7]}$$

$$I_C=I_L+I_V \quad \text{[Equation 8]}$$

According to an embodiment of the present disclosure, when the vehicle is in a driving state, and when the controller 150 determines that the current $I_V$ ($I_{V1}+I_{V2}$) input to the vehicle load LOAD 1 and LOAD 2, that is, a difference between the current $I_{LDC}$ output from the LDC 110 and the current $I_S$ input to the power control device 120 is less than a reference value, based on Equation 1, the controller 150 may determine that the sensing error of the LDC occurs. In this case, the reference value may include a small value close to zero.

In addition, when the current $I_V$ ($I_{V1}+I_{V2}$) input to the vehicle load LOAD 1 and LOAD 2, that is, the difference between the current $I_{LDC}$ output from the LDC 110 and the current $I_S$ input to the power control device 120 is greater than or equal to the reference value, the controller 150 may compare a current input to the load of the vehicle obtained when the LDC 110 is in the current output state and the switching element of the power control device 120 is turned on with a current input to the load of the vehicle obtained when the LDC 110 is in the current output state and the switching element of the power control device 120 is turned off, based on Equation 1, and may determine whether the sensing error of the LDC 110 occurs, based on a result of the comparison. As an example, the controller 150 may determine whether the sensing error of the LDC 110 occurs by using Equation 1 and Equation 4.

When current values input to the vehicle load, which are calculated by Equation 1 and Equation 4 are not the same to each other, the controller 150 may determine that the sensing error of the LDC 110 occurs. In contrast, when the controller 150 determines that the current values input to the vehicle load, which are calculated by Equation 1 and Equation 4 are the same to each other, the controller 150 may determine that the sensing of the LDC 110 is in a normal state.

According to another embodiment, when the vehicle is in the parking state, and the current values input to the vehicle load, which are calculated by Equation 1 and Equation 4 are the same to each other, the controller 150 may calculate the current $I_L$ input to the load LOAD 3 and LOAD 4 for controlling the vehicle driving in a first condition to a third condition when the LDC 110 is in the current output cutoff state and the switching element of the power control device 120 is turned on, and may determine whether the sensing error of the LDC occurs, based on a result of the calculation.

According to the embodiment, the controller 150 may calculate the current output to the load for controlling the vehicle driving in the first condition, based on a difference (by using Equation 2) between the current $I_S$ input to the power control device 120 obtained when the LDC 110 is in the current output state and the switching element of the power control device 120 is turned on and the charge current Ic of the battery.

According to the embodiment, the controller 150 may calculate the current output to the load for controlling the vehicle driving in the second condition, based on a value (by using Equation 5) of the discharge current Ic of the battery obtained when the LDC 110 is in the current output state and the switching element of the power control device 120 is turned off.

According to an embodiment, the controller 150 may calculate the current output to the load for controlling the vehicle driving in the third condition, based on the difference value (using Equation 7) between the discharge current Ic of the battery obtained when the LDC 110 is in the current output cutoff state and the switching element of the power control device 120 is turned on and the current $I_S$ output from the switching element of the power control device 120.

The controller 150 may compare the result calculated in the first condition with the result calculated in the third condition, and as a result of the comparison, when currents input to the load for controlling the vehicle driving calculated in the first condition and the third condition are different from each other, the controller 150 may determine that the sensing error of the LDC 110 occurs. In addition, as the result of the comparison, when the controller 150 determines that the currents $I_L$ input to the load for controlling the vehicle driving calculated in the first condition and the third condition are the same to each other, the controller 150 may compare the current $I_V$ input to the vehicle load obtained when the LDC 110 is in the current output state and the switching element of the power control device 120 is turned on with the current $I_V$ input to the vehicle load obtained when the LDC 110 is in the current output cutoff state and the switching element of the power control device 120 is turned on.

When the current $I_V$ input to the vehicle load obtained when the LDC 110 is in the current output state and the switching element of the power control device 120 is turned on is different from the current $I_V$ input to the vehicle load obtained when the LDC 110 is in the current output cutoff state and the switching element of the power control device 120 is turned on, the controller 150 may determine that the sensing error of the LDC 110 occurs.

When the controller 150 determines the sensing error of the LDC 110, the controller 150 may allow a result of the determination to be output through the output device 140.

Figure 6:
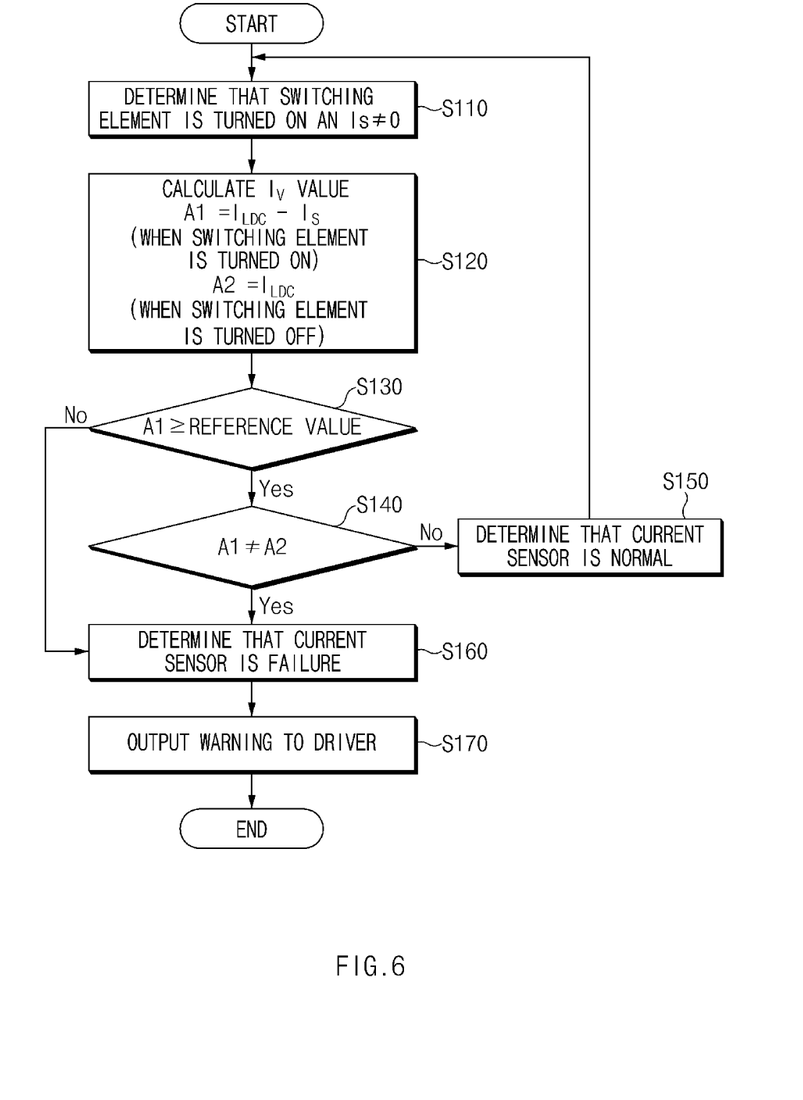
FIG. 6 is a flowchart illustrating a method of determining an LDC error state according to an embodiment of the present disclosure.

FIG. 6 is a flowchart illustrating a method of determining an LDC error state according to an embodiment of the present disclosure.

As illustrated in FIG. 6, when the vehicle is in a driving state, and when it is determined that the switching element of the power control device 120 is turned on and the current $I_S$ output from the power control device 120 or input to the power control device 120 is not zero (S110), the controller 150 may calculate the current $I_V$ input to the vehicle load LOAD 1 and LOAD 2 (S120). According to an embodiment, in S120, the controller 150 may calculate the current (A1) input to the load of the vehicle obtained when the LDC 110 is in the current output state and the switching element of the power control device 120 is turned on, and the current (A2) input to the load of the vehicle obtained when the LDC 110 is in the current output state and the switching element of the power control device 120 is turned off.

The controller 150 determines whether the current $I_V$ input to the vehicle load LOAD 1 and LOAD 2 when the LDC 110 is in the current output state and the switching element of the power control device 120 is turned on, based on Equation 1, that is, the difference value (A1) between the current $I_{LDC}$ output from the LDC 110 and the current $I_S$ input to the power control device 120 is greater than or equal to the reference value (S130).

In S130, when the controller 150 determines that the difference value between the current $I_{LDC}$ output from the LDC 110 and the current $I_S$ input to the power control device 120 is greater than or equal to the reference value (Y), e.g., zero, the controller 150 determines whether the current (A1) input to the load of the vehicle obtained when the LDC 110 is in the current output state and the switching element of the power control device 120 is turned on is not the same as the current (A2) input to the load of the vehicle obtained when the LDC 110 is in the current output state and the switching element of the power control device 120 is turned off (S140). In S130, when the controller 150 determines that the difference value (A1) between the current $I_{LDC}$ output from the LDC 110 and the current $I_S$ input to the power control device 120 is not greater than or equal to the reference value (N), the controller 150 determines that the sensing error of the LDC 110 occurs (S160).

In S140, when the controller 150 determines that the current (A1) input to the load of the vehicle obtained when the LDC 110 is in the current output state and the switching element of the power control device 120 is turned on is not the same as the current (A2) input to the load of the vehicle obtained when the LDC 110 is in the current output state and the switching element of the power control device 120 turned off (Y), the controller 150 determines that the sensing error of the LDC 110 occurs (S160). In contrast, in S140, when the controller 150 determines that the current (A1) input to the load of the vehicle obtained when the LDC 110 is in the current output state and the switching element of the power control device 120 is turned on is the same as the current (A2) input to the load of the vehicle obtained when the LDC 110 is in the current output state and the switching element of the power control device 120 turned off (N), the controller 150 determines that the sensing of the LDC 110 is normal (S150).

When the controller 150 determines the sensing error of the LDC 110, the controller 150 may output the result of the sensing error determination through the output device 140 (S170).

Figure 7:
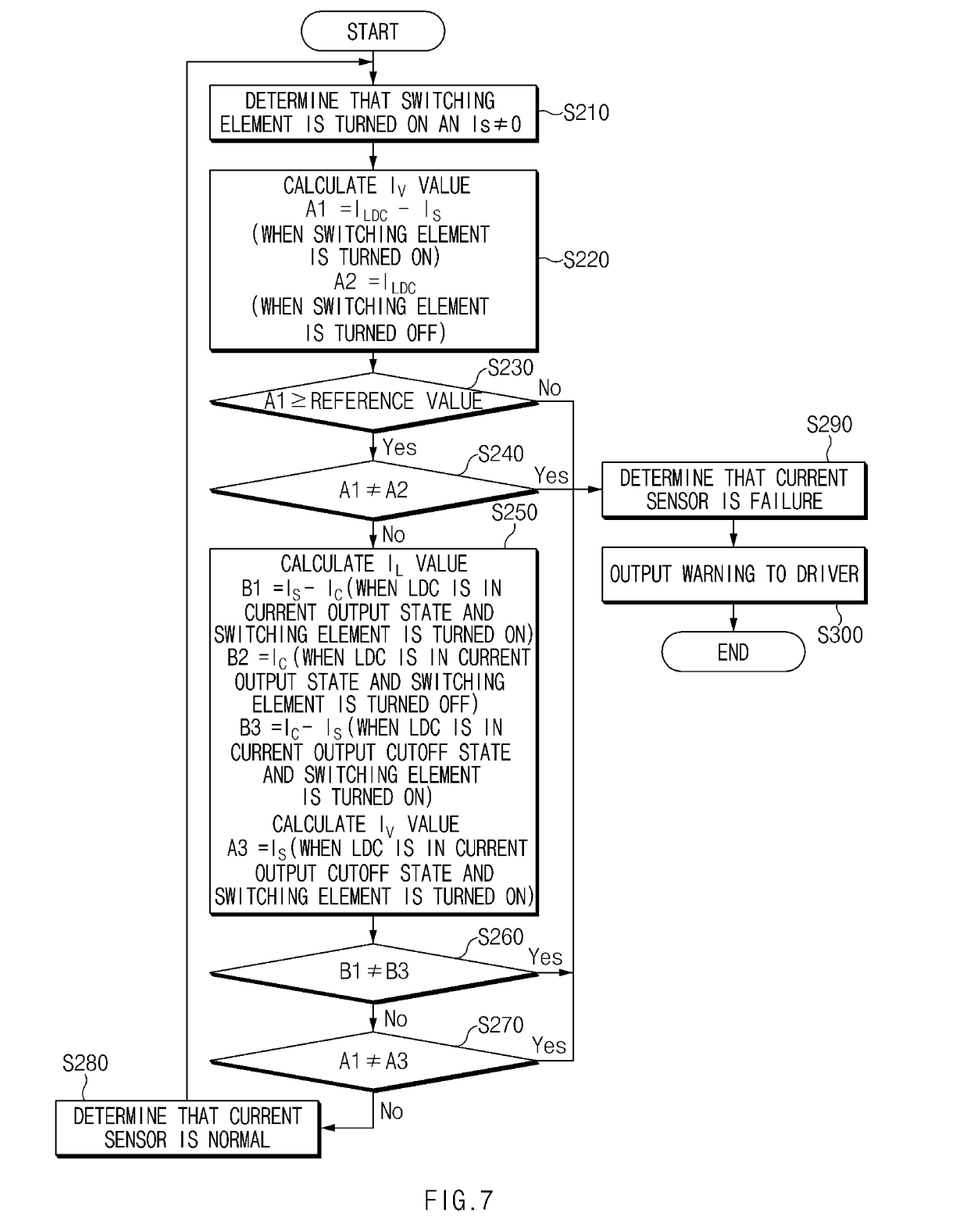
FIG. 7 is a flowchart illustrating a method of determining an LDC error state according to another embodiment of the present disclosure.

FIG. 7 is a flowchart illustrating a method of determining an LDC error state according to another embodiment of the present disclosure.

As illustrated in FIG. 7, when the vehicle is in a stopped state, and when the controller 150 determines that the switching element of the power control device 120 is turned on and the current $I_S$ output or input from/to the power control device 120 is not zero (S210), the controller 150 may calculate the current $I_V$ input to the vehicle load LOAD 1 and LOAD 2 (S220). According to an embodiment, in S220, the controller 150 may calculate the current (A1) input to the load of the vehicle obtained when the LDC 110 is in the current output state and the switching element of the power control device 120 is turned on, and the current (A2) input to the load of the vehicle obtained when the LDC 110 is in the current output state and the switching element of the power control device 120 is turned off.

The controller 150 determines whether the current $I_V$ input to the vehicle load LOAD 1 and LOAD 2 when the LDC 110 is in the current output state and the switching element of the power control device 120 is turned on, that is, the difference value (A1) between the current $I_{LDC}$ output from the LDC 110 and the current $I_S$ input to the power control device 120 is greater than or equal to the reference value, based on Equation 1 (S230).

In S230, when the controller 150 determines that the difference value (A1) between the current $I_{LDC}$ output from the LDC 110 and the current $I_S$ input to the power control device 120 is greater than or equal to the reference value (Y), the controller 150 determines whether the current (A1) input to the load of the vehicle obtained when the LDC 110 is in the current output state and the switching element of the power control device 120 is turned on is not the same as the current (A2) input to the load of the vehicle obtained when the LDC 110 is in the current output state and the switching element of the power control device 120 is turned off (S240). In S230, when the controller 150 determines that the difference value (A1) between the current $I_{LDC}$ output from the LDC 110 and the current $I_S$ input to the power control device 120 is not greater than the reference value (N), the controller 150 determines that the sensing error of the LDC 110 occurs (S290).

In S240, when the controller 150 determines the current (A1) input to the load of the vehicle obtained when the LDC 110 is in the current output state and the switching element of the power control device 120 is turned on is not the same as the current (A2) input to the load of the vehicle obtained when the LDC 110 is in the current output state and the switching element of the power control device 120 is turned off (Y), the controller 150 determines that the sensing error of the LDC 110 occurs (S290) In contrast, in S240, when the controller 150 determines the current (A1) input to the load of the vehicle obtained when the LDC 110 is in the current output state and the switching element of the power control device 120 is turned on is the same as the current (A2) input to the load of the vehicle obtained when the LDC 110 is in the current output state and the switching element of the power control device 120 is turned off (N), the controller 150 may calculate the current $I_L$ input to the load LOAD 3 and LOAD 4 for controlling the vehicle driving in the first condition to the third condition, and the current $I_V$ input to the vehicle load obtained when the LDC 110 is in the current output cutoff state and the switching element of the power control device 120 is turned on, and may determine whether the sensing error of the LDC 110 occurs, based on the result of the calculation (S250).

In S250, the controller 150 may calculate the current $I_L$ output to the load for controlling the vehicle driving in the first condition, based on the difference value (B1, using Equation 2) between the current $I_S$ input to the power control device 120 obtained when the LDC 110 is in the current output state and the switching element of the power control device 120 is turned on and the charge current Ic of the battery.

In addition, according to an embodiment, in S250, the controller 150 may calculate the current $I_L$ output to the load for controlling the vehicle driving in the second condition, based on the value (B2, using Equation 5) of the discharge current Ic of the battery obtained when the LDC 110 is in the current output state and the switching element of the power control device 120 is turned off.

In addition, according to an embodiment, in S250, the controller 150 may calculate the current $I_L$ output to the load for controlling the vehicle driving in the third condition, based on the difference value (B3, using Equation 7) between the discharge current $I_C$ of the battery obtained when the LDC 110 is in the current output cutoff state and the switching element of the power control device 120 is turned on and the current $I_S$ output from the power control device 120.

In S250, the controller 150 may calculate the current $I_V$ (A3) input to the vehicle load obtained when the LDC 110 is in the current output cutoff state and the switching element of the power control device 120 is turned on, by using the current $I_S$ (using Equation 6) output from the power control device 120.

The controller 150 compares the current B1 calculated in the above-described first condition and the current B3 calculated in the third condition, and as a result of the comparison, determines whether the currents (B1, B3) input to the load for controlling the vehicle driving calculated in the first condition and the third condition are not the same to each other (S260).

In S260, when the controller 150 determines that the currents (B1, B3) input to the load for controlling the vehicle driving calculated in the first condition and third condition are not the same to each other, the controller 150 may determine that the sensing error of the LDC 110 occurs (S290). In contrast, in S260, when the controller 150 determines that the currents (B1,B3) input to the load for controlling the vehicle driving calculated in the first condition and third condition are the same to each other (N), as a result of the comparison, the controller 150 compares the current A1 input to the vehicle load obtained when the LDC 110 is in the current output state and the switching element of the power control device 120 is turned on with the current A3 input to the vehicle load obtained when the LDC 110 is in the current output cutoff state and the switching element of the power control device 120 is turned on, and determines whether the currents (A1,A3) are not the same to each other (S270).

In S270, when the controller 150 determines that the current A1 input to the vehicle load obtained when the LDC 110 is in the current output state and the switching element of the power control device 120 is turned on is the same as the current A3 input to the vehicle load obtained when the LDC 110 is in the current output cutoff state and the switching element of the power control device 120 is turned on, the controller 150 may determine that the sensing of the LDC 110 is normal (S280). In addition, in S270, when the controller 150 determines that the current A1 input to the vehicle load obtained when the LDC 110 is in the current output state and the switching element of the power control device 120 is turned on is not the same as the current A3 input to the vehicle load obtained when the LDC 110 is in the current output cutoff state and the switching element of the power control device 120 is turned on (Y), the controller 150 may determine that the sensing error of the LDC 110 occurs (S290).

When the controller 150 determines that the sensing error of the LDC 110 occurs, the controller 150 may allow the determination of the sensing error to be output through the output device 140 (S300).

Figure 8:
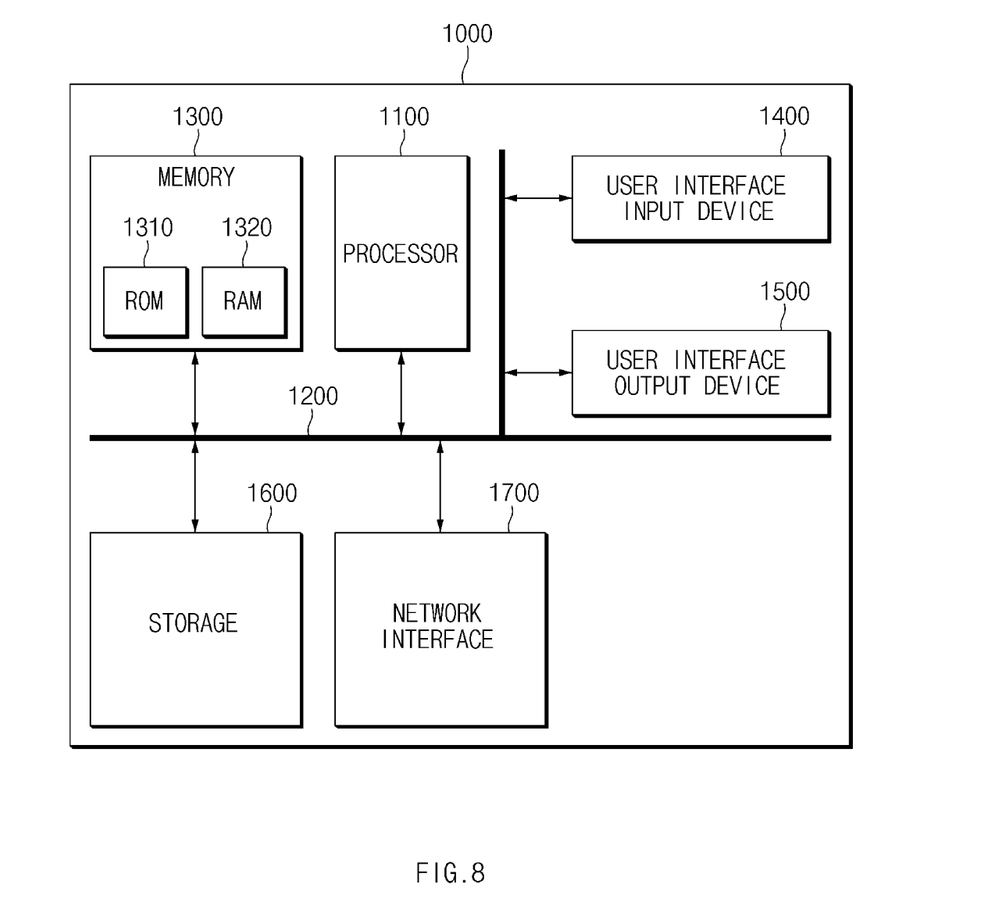
FIG. 8 is a diagram illustrating a configuration of a computing system executing a method according to an embodiment of the present disclosure.

FIG. 8 is a diagram illustrating a configuration of a computing system executing a method according to an embodiment of the present disclosure.

Referring to FIG. 8, a computing system 1000 may include at least one processor 1100, a memory 1300, a user interface input device 1400, a user interface output device 1500, storage 1600, and a network interface 1700, which are connected through a bus 1200 with one another.

The processor 1100 may be a central processing unit (CPU) or a semiconductor device that processes instructions stored in at least one of the memory 1300 or the storage 1600. The memory 1300 and the storage 1600 may include various types of volatile or nonvolatile storage media. For example, the memory 1300 may include a read only memory (ROM) 1310 and a random access memory (RAM) 1320.

Accordingly, the operations of the method or the algorithm described in connection with the embodiments disclosed herein may be embodied directly in hardware or a software module executed by the processor 1100, or in a combination thereof. The software module may reside on a storage medium (that is, at least one of the memory 1300 or the storage 1600) such as a RAM, a flash memory, a ROM, an EPROM, an EEPROM, a register, a hard disk, a removable disk, a CD-ROM. The storage medium may be coupled to the processor 1100, and the processor 1100 may read information out of the storage medium and may record information in the storage medium. Alternatively, the storage medium may be integrated with the processor 1100. The processor 1100 and the storage medium may reside in an application specific integrated circuit (ASIC). The ASIC may reside within a user terminal. In another case, the processor 1100 and the storage medium may reside in the user terminal as separate components.

According to an embodiment of the present disclosure, an LDC sensing error determination apparatus and a method allow the sensing error of the LDC to be determined without additional equipment, thereby preventing a battery discharge and providing a safe driving environment to a driver through determination of external defects in advance.

The above description is merely illustrative of the technical idea of the present disclosure, and those of ordinary skill in the art to which the present disclosure pertains will be able to make various modifications and variations without departing from the essential characteristics of the present disclosure.

Accordingly, the embodiments disclosed in the present disclosure are not intended to limit the technical idea of the present disclosure, but to explain the technical idea, and the scope of the technical idea of the present disclosure is not limited by these embodiments. The scope of protection of the present disclosure should be interpreted by the following claims, and all technical ideas within the scope equivalent thereto should be construed as being included in the scope of the present disclosure.

What is claimed is:

1. An apparatus for determining a sensing error of a low voltage DC-DC converter (LDC) of a vehicle,
    wherein the LDC is configured to control and sense an output and an output cutoff of a first current inputted to a first load of the vehicle and an output and an output cutoff of a second current for charging a battery,
    wherein the apparatus comprises:
       a battery control device configured to sense the second current and a third current for discharging the battery;
       a power control device configured to:
          receive the first current, the second current, and the third current, and
          calculate a fourth current inputted to a second load for controlling a vehicle driving by controlling an operation of a switching element; and
       a controller configured to:
          determine whether the sensing error of the LDC occurs, based on the first current, the second current, the third current and the fourth current.

2. The apparatus of claim 1, wherein the controller determines that the sensing error of the LDC occurs when a value of the first current inputted to the first load of the vehicle obtained while the LDC is in a current output state and the switching element is turned on is less than a reference value.

3. The apparatus of claim 1, wherein the controller compares the first current inputted to the first load of the vehicle obtained when the LDC is in a current output state and the switching element is turned on with the first current inputted to the first load of the vehicle obtained when the switching element is turned off, and determines whether the sensing error of the LDC occurs based on a result of the comparison.

4. The apparatus of claim 1, wherein the controller calculates the fourth current inputted to the second load for controlling the vehicle driving in each of a first condition, a second condition, and a third condition when the LDC is in a current output cutoff state, and the switching element is turned on, and determines whether the sensing error of the LDC occurs based on a result of the calculation.

5. The apparatus of claim 4, wherein the controller calculates the fourth current inputted to the second load for controlling the vehicle driving in the first condition, based on a difference between a current inputted to the power control device obtained when the LDC is in a current output state and the switching element is turned on and the second current for charging the battery.

6. The apparatus of claim 4, wherein the controller calculates the fourth current inputted to the second load for controlling the vehicle driving in the second condition, based on the third current for discharging current of the battery obtained when the LDC is in a current output state and the switching element is turned off.

7. The apparatus of claim 4, wherein the controller calculates the fourth current inputted to the second load for controlling the vehicle driving in the third condition, based on a difference between the third current for discharging the battery obtained when the LDC is in the current output cutoff state and the switching element is turned on and a current outputted from the power control device.

8. The apparatus of claim 4, wherein, upon determining that the fourth current inputted to the second load for controlling the vehicle driving calculated in the first condition and the third condition are different from each other, the controller compares a result calculated in the first condition with a result calculated in the third condition and determines that the sensing error of the LDC occurs as a result of the comparison.

9. The apparatus of claim 8, wherein, upon determining that the fourth current inputted to the second load for controlling the vehicle driving are the same in the first condition and the third condition, the controller compares the first current inputted to the first load of the vehicle obtained when the LDC is in a current output state and the switching element is turned on with the first current inputted to the first load of the vehicle obtained when the LDC is in the current output cutoff state and the switching element is turned on as a result of the comparison.

10. The apparatus of claim 9, wherein, when the first current inputted to the first load of the vehicle obtained while the LDC is in the current output state and the switching element is turned on is different from the first current inputted to the first load of the vehicle obtained while the LDC is in the current output cutoff state and the switching element is turned on, the controller determines that the sensing error of the LDC occurs.

11. A method of determining a sensing error of a low voltage DC-DC converter (LDC) of a vehicle, the method comprising:
    determining whether the sensing error of the LDC occurs, based on a first current, a second current, a third current and a fourth current,
    wherein the first current comprises a current inputted to a first load for the vehicle, wherein the second current comprises a current for charging a battery, wherein the third current comprises a current for discharging a battery, wherein the fourth current comprises a current inputted to a second load for the vehicle.

12. The method of claim 11, further comprising, when a value of the first current inputted to the first load of the vehicle obtained while the LDC is in a current output state and the switching element is turned on is less than a reference value,
    determining that the sensing error of the LDC occurs.

13. The method of claim 11, further comprising:
    comparing the first current inputted to the first load of the vehicle obtained when the LDC is in a current output state and the switching element is turned on with the first current inputted to the first load of the vehicle obtained when the switching element is turned off; and
    determining whether the sensing error of the LDC occurs, based on a result of the comparison.

14. The method of claim 11, further comprising:
when the LDC is in a current output cutoff state and the switching element is turned on, calculating the fourth current inputted to the second load for controlling the vehicle driving in each of a first condition, a second condition, and a third condition; and
determining whether the sensing error of the LDC occurs, based on a result of the calculation.

15. The method of claim 14, further comprising calculating the fourth current inputted to the second load for controlling the vehicle driving in the first condition, based on a difference between a current inputted to the power control device obtained when the LDC is in a current output state and the switching element is turned on and the second current for charging the battery.

16. The method of claim 14, further comprising calculating the fourth current inputted to the second load for controlling the vehicle driving in the second condition, based on the third current for discharging the battery obtained when the LDC is in a current output state and the switching element is turned off.

17. The method of claim 14, further comprising calculating the fourth current inputted to the second load for controlling the vehicle driving in the third condition, based on a difference between the third for discharging current of the battery obtained when the LDC is in the current output cutoff state and the switching element is turned on and a current outputted from the power control device.

18. The method of claim 14, further comprising:
comparing the fourth current calculated in the first condition with the fourth current calculated in the third condition; and
upon determining that the fourth current inputted to the second load for controlling the vehicle driving calculated in the first condition and the third condition are different from each other, determining that the sensing error of the LDC occurs, as a result of the comparison.

19. The method of claim 18, further comprising, upon determining that the fourth current input to the second load for controlling the vehicle driving are the same in the first condition and the third condition, as the result of the comparison, comparing the first current inputted to the first load of the vehicle obtained when the LDC is in a current output state and the switching element is turned on with the first current inputted to the first load of the vehicle obtained when the LDC is in the current output cutoff state and the switching element is turned on.

20. The method of claim 19, further comprising, when the first current inputted to the first load of the vehicle obtained while the LDC is in the current output state and the switching element is turned on is different from the first current inputted to the first load of the vehicle obtained while the LDC is in the current output cutoff state and the switching element is turned on, determining that the sensing error of the LDC occurs.

* * * * *